United States Patent
Mariglio, III et al.

(10) Patent No.: US 10,609,499 B2
(45) Date of Patent: Mar. 31, 2020

(54) SPATIALLY AWARE DYNAMIC RANGE CONTROL SYSTEM WITH PRIORITY

(71) Applicant: Boomcloud 360, Inc., Encinitas, CA (US)

(72) Inventors: Joseph Mariglio, III, Encinitas, CA (US); Zachary Seldess, San Diego, CA (US)

(73) Assignee: Boomcloud 360, Inc., Encinitas, CA (US)

( * ) Notice: Subject to any disclaimer, the term of this patent is extended or adjusted under 35 U.S.C. 154(b) by 0 days.

(21) Appl. No.: 16/186,459

(22) Filed: Nov. 9, 2018

(65) Prior Publication Data
US 2019/0191260 A1 Jun. 20, 2019

Related U.S. Application Data

(60) Provisional application No. 62/599,601, filed on Dec. 15, 2017.

(51) Int. Cl.
*H04S 7/00* (2006.01)
*H04S 1/00* (2006.01)
(Continued)

(52) U.S. Cl.
CPC .............. *H04S 7/30* (2013.01); *H03G 3/02* (2013.01); *H03G 7/002* (2013.01); *H04S 1/002* (2013.01);
(Continued)

(58) Field of Classification Search
CPC ... H04S 7/30; H04S 1/007; H04S 1/00; H04S 2400/13; H04S 1/002; H04S 3/002;
(Continued)

(56) References Cited

U.S. PATENT DOCUMENTS 8,644,526 B2 2/2014 Ehara et al.
9,191,045 B2 * 11/2015 Purnhagen ............ G10L 19/008
(Continued)

FOREIGN PATENT DOCUMENTS

TW 201503711 A 1/2015

OTHER PUBLICATIONS

PCT International Search Report and Written Opinion, PCT Application No. PCT/US2018/063152, dated Mar. 27, 2019, 12 pages.
(Continued)

*Primary Examiner* — Jason R Kurr
(74) *Attorney, Agent, or Firm* — Fenwick & West LLP

(57) ABSTRACT

An audio signal is limited in an audio coordinate system using gain factors applied in another audio coordinate system. A first component and a second component in a first audio coordinate system is generated from a third component and a fourth component of the audio signal in a second audio coordinate system. An amplitude threshold defining a maximum level for each of the third component and the fourth component is determined. One or more gain factors are applied to each of the third component and the fourth component to generate an adjusted third component and an adjusted fourth component, and a first output channel and a second output channel in the second audio coordinate system are generated from the adjusted third and fourth components. The first and second output channels are each limited below the amplitude threshold from application of the one or more gain factors.

31 Claims, 12 Drawing Sheets

(51) Int. Cl.
*H03G 3/02* (2006.01)
*H03G 7/00* (2006.01)
*H04S 3/00* (2006.01)

(52) U.S. Cl.
CPC .............. H04S 1/007 (2013.01); *H04S 3/002* (2013.01); *H04S 2400/13* (2013.01)

(58) Field of Classification Search
CPC ........ H03G 3/02; H03G 7/002; H03G 3/3005; H03G 3/301; H03G 11/00; H03G 11/04
See application file for complete search history.

(56) References Cited

U.S. PATENT DOCUMENTS

| | | | |
|---|---|---|---|
| 9,661,438 B1* | 5/2017 | Yang | H04R 3/007 |
| 9,721,578 B2 | 8/2017 | Riedmiller et al. | |
| 2009/0022328 A1* | 1/2009 | Neugebauer | H04S 1/005 |
| | | | 381/27 |
| 2009/0175472 A1* | 7/2009 | Gunnarsson | H04R 1/403 |
| | | | 381/303 |
| 2014/0270184 A1* | 9/2014 | Beaton | H04S 7/307 |
| | | | 381/17 |
| 2015/0356978 A1 | 12/2015 | Dickins et al. | |
| 2016/0007131 A1* | 1/2016 | Tammi | H04S 1/002 |
| | | | 381/26 |
| 2016/0249151 A1 | 8/2016 | Grosche et al. | |

OTHER PUBLICATIONS

Taiwan Intellectual Property Office, Office Action, TW Patent Application No. 107145351, dated Oct. 17, 2019, ten pages.

* cited by examiner

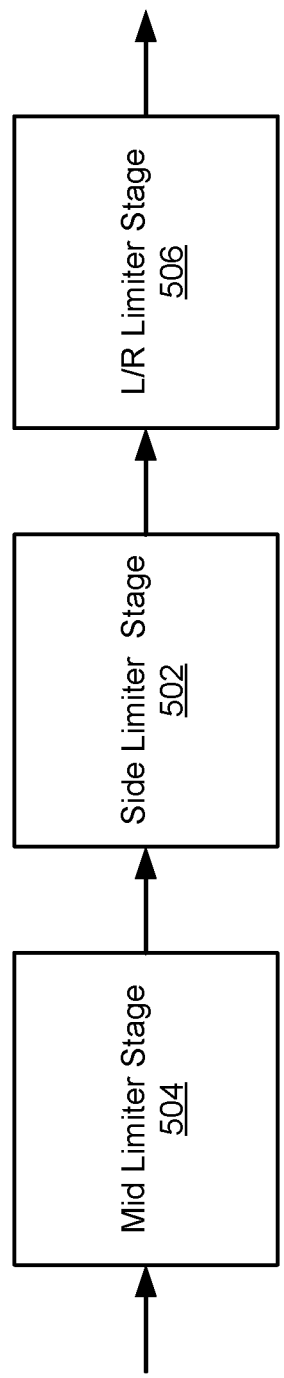

600

Generate a mid component and a side component from an audio signal including a left input channel and a right input channel
605

Determine a left-right threshold
610

Apply one or more gain factors to each of the mid component and the side component to generate an adjusted mid component and an adjusted side component
615

Generate a left output channel and a right output channel each limited below the left-right threshold from the adjusted mid component and the adjusted side component
620

```
┌─────────────────────────────────────────────────────────────┐
│ Determine a priority for spatial limiting between the mid    │
│ component and the side component to define a selected        │
│ component and a non-selected component                       │
│ 705                                                          │
└─────────────────────────────────────────────────────────────┘
                              │
                              ▼
┌─────────────────────────────────────────────────────────────┐
│ Determine a gain factor for the selected component           │
│ 710                                                          │
└─────────────────────────────────────────────────────────────┘
                              │
                              ▼
┌─────────────────────────────────────────────────────────────┐
│ Apply the gain factor to the selected component              │
│ 715                                                          │
└─────────────────────────────────────────────────────────────┘
                              │
                              ▼
┌─────────────────────────────────────────────────────────────┐
│ Determine a left-right gain factor for the selected          │
│ component and the non-selected component using the gain      │
│ factor for the selected component                            │
│ 720                                                          │
└─────────────────────────────────────────────────────────────┘
                              │
                              ▼
┌─────────────────────────────────────────────────────────────┐
│ Apply the left-right gain factor to the selected component   │
│ to generate an adjusted selected component and to the        │
│ non-selected component to generate an adjusted non-selected  │
│ component                                                    │
│ 725                                                          │
└─────────────────────────────────────────────────────────────┘
```

Determine a priority for spatial limiting between the mid component and the side component to define the mid and side components as equal priority components
805

↓

Determine a mid gain factor for the mid component
810

↓

Apply the mid gain factor to the mid component
815

↓

Determine a side gain factor for the side component
820

↓

Apply the side gain factor to the side component
825

↓

Determine a left-right gain factor for the mid component and the side component using the mid gain factor and the side gain factor
830

↓

Apply the left-right gain factor to the mid component to generate an adjusted mid component and to the side component to generate an adjusted side component
835

Determine a priority for spatial limiting between the mid component and the side component to define a primary component and a secondary component
905

Determine a primary gain factor for the primary component
910

Apply the primary gain factor to the primary component
915

Determine a secondary gain factor for the secondary component using the primary gain factor
920

Apply the secondary gain factor to the secondary component
925

Determine a left-right gain factor using the primary gain factor and the secondary gain factor
930

Apply the left-right gain factor to the primary component to generate an adjusted primary component, and the left-right gain factor to the secondary component to generate an adjusted secondary component
935

Generate a first component and a second component in a first audio coordinate system from a third component and a fourth component of an audio signal in a second audio coordinate system
1005

Determine an amplitude threshold in the second audio coordinate system defining a maximum level for each of the third component and the fourth component
1010

Apply one or more gain factors to each of the first component and the second component to generate an adjusted first component and an adjusted second component
1015

Generate a first output channel and a second output channel each limited below the amplitude threshold from the adjusted first component and the adjusted second component
1020

FIG. 10

SPATIALLY AWARE DYNAMIC RANGE CONTROL SYSTEM WITH PRIORITY

CROSS REFERENCE TO RELATED APPLICATION

This application claims the benefit of U.S. Provisional Application No. 62/599,601, filed Dec. 15, 2017, which is incorporated by reference in its entirety.

TECHNICAL FIELD

The subject matter described herein relates to audio processing, and more particularly to dynamic range control of an audio signal in a spatially-aware context.

BACKGROUND

Range control refers to limiting of an audio signal below a threshold amount. For a stereo audio signal in left-right space including a left channel and right channel, range control can be achieved in the left-right space by applying gains to the left and right channels as needed so that the peak of each channel is below the threshold. However, it is desirable to shift artifacts of range control to different spatial locations.

SUMMARY

Embodiments relate to providing range control of an audio signal in a spatially-aware context. The audio signal is limited in an audio coordinate system (e.g., left-right space) using gain factors applied in another audio coordinate system (e.g., mid-side space) to shift artifacts of hard limiting to different spatial locations. A first (e.g., mid) component and a second (e.g., side) component is generated from a third component (e.g., a left channel) and a fourth component (e.g., a right channel) of the audio signal. An amplitude threshold in the second audio coordinate system defining a maximum level for each of the third component and the fourth component is determined. One or more gain factors are applied to each of the first component and the second component to generate an adjusted first component and an adjusted second component in the first audio coordinate system. A first (e.g., left) output channel and a second (e.g., right) output channel in the second audio coordinate system are generated from the adjusted first component and adjusted second component. The first and second output channels are each limited below the amplitude threshold from the one or more gain factors applied to each of the first component and the second component.

In some embodiments, a non-transitory computer readable medium storing program code that when executed by a processor configures the processor to: generate a first component and a second component in a first audio coordinate system from a third component and a fourth component of an audio signal in a second audio coordinate system; determine an amplitude threshold in the second audio coordinate system defining a maximum level for each of the third component and the fourth component; apply one or more gain factors to each of the first component and the second component to generate an adjusted first component and an adjusted second component in the first audio coordinate system; and generate a first output channel and a second output channel in the second audio coordinate system from the adjusted first component and the adjusted second component. The first and second output channels are each limited below the amplitude threshold from the one or more gain factors applied to each of the first component and the second component.

In some embodiments, a system for processing an audio signal includes processing circuitry configured to: generate a first component and a second component in a first audio coordinate system from a third component and a fourth component of an audio signal in the second audio coordinate system; determine an amplitude threshold in the second audio coordinate system defining a maximum level for each of the third and the fourth component; apply one or more gain factors to each of the first component and the second component to generate an adjusted first component and an adjusted second component in the first audio coordinate system; and generate a first output channel and a second output channel in the second audio coordinate system from the adjusted first component and the adjusted second component. The first and second output channels in combination are each limited below the amplitude threshold from the one or more gain factors applied to each of the first component and the second component.

Other aspects include components, devices, systems, improvements, methods, processes, applications, computer readable mediums, and other technologies related to any of the above.

BRIEF DESCRIPTION OF DRAWINGS

FIG. 5A is a block diagram of a side channel gain application, followed by a mid channel gain application, followed by a L/R gain application, in accordance with some embodiments.

FIG. 5B is a block diagram of a mid channel gain application, followed by a side channel gain application, followed by an L/R gain application, in accordance with some embodiments.

FIG. 6 is a flow chart of a method for spatially limiting an audio signal, in accordance with some embodiments.

FIG. 7 is a flow chart of a process for spatially limiting an audio signal using side (or mid) limiting followed by left-right limiting, in accordance with some embodiments.

FIG. 8 is a flow chart of a process for spatially limiting an audio signal using parallel side and mid limiting followed by left-right limiting, in accordance with some embodiments.

FIG. 9 is a flow chart of a process for spatially limiting an audio signal using serial side, mid, and left-right limiting, in accordance with some embodiments.

FIG. 10 is a flow chart of a process for controlling audio signal components in one audio coordinate system to achieve a constraint defined in another audio coordinate system, in accordance with some embodiments.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments of the present disclosure relate to range control of an audio signal in left-right space using gain factors applied in mid-side space. The audio signal including a left channel and a right channel are converted to a mid component and a side component. Gain factors are applied to each of the mid component and the side component to generate an adjusted mid component and an adjusted side component. The adjusted components are converted back to left-right space into a left output channel and a right output channel that each satisfies a left-right threshold in left-right space.

The gain factors may be defined according to a priority of spatial limiting between the mid and side components. The priority of spatial limiting may be adjustable, and defines a desired shifting of artifacts into different spatial locations to satisfy the left-right threshold. A gain factor for a lower priority component may be defined using a gain factor for the higher priority component so that the gain factor for the lower priority component is applied only when a gain reduction budget of the higher priority component has been reached without satisfaction of the left-right threshold. As such, the left-right threshold is satisfied for each of the left and right output channels according to the priority of spatial limiting between the mid and side components.

Example Audio Processing System

Figure 1:
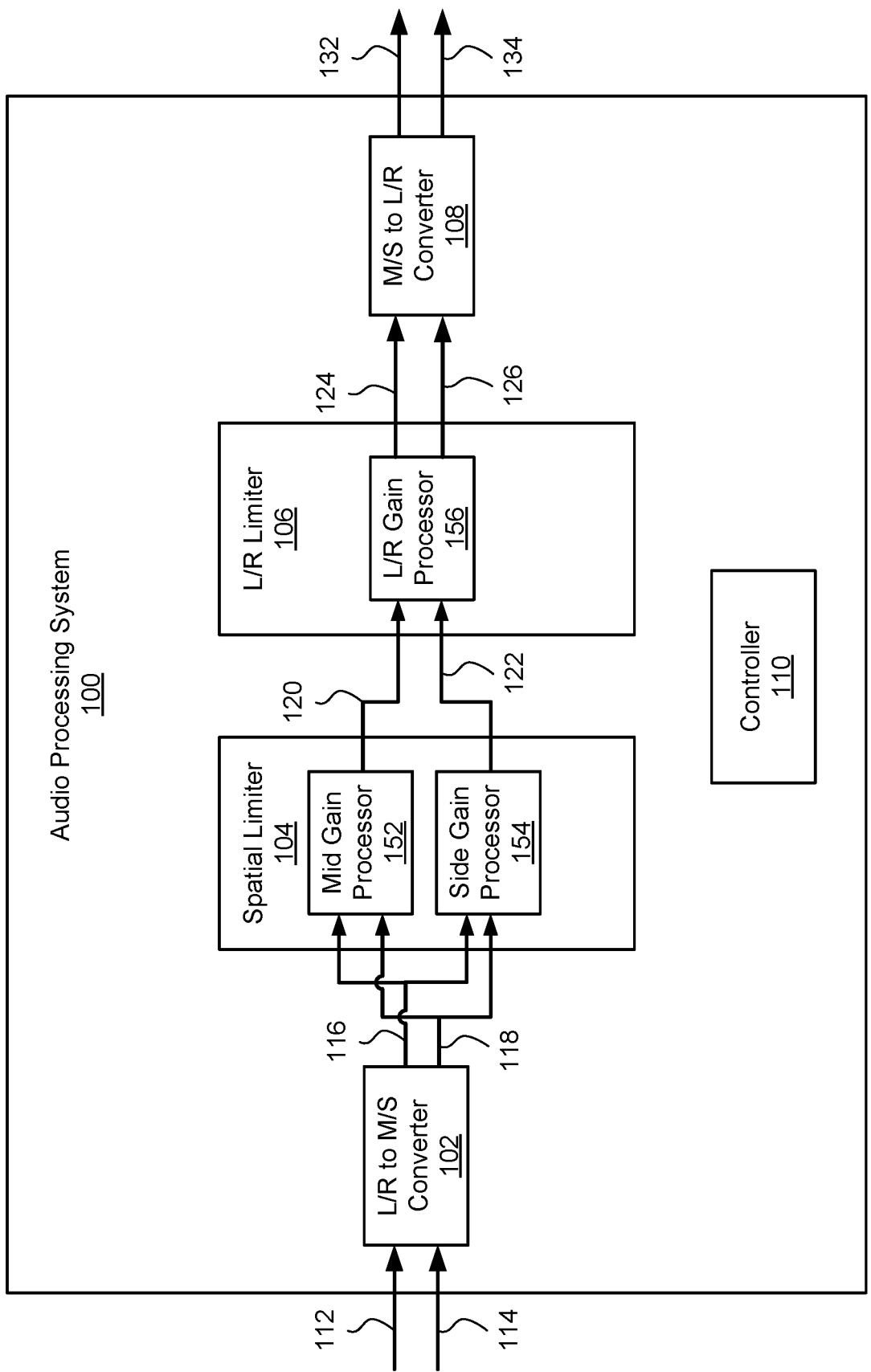
FIG. 1 is a schematic block diagram of an audio processing system, in accordance with some embodiments.

FIG. 1 is a schematic block diagram of an audio processing system 100, in accordance with some embodiments. The audio processing system 100 receives an input audio signal including a left input channel 112 and a right input channel 114, and gain adjusts a mid component 116 or a side component 118 of the channels 112, 114 to generate an output audio signal including a left output channel 132 and a right output channel 134 each having peaks that are limited below a left-right threshold $\vartheta_{LR}$. The audio processing system 100 provides for dynamic range control of the input audio signal in a spatially-aware context. The audio processing system 100 can shift the artifacts of hard limiting into different spatial locations (e.g., mid or side components of the input audio signal) depending on where the input energy is focused, and settings that configure the operation of the audio processing system 100. The settings may be determined programmatically, or may be specified by a user.

The audio processing system 100 includes an L/R to M/S converter 102, a spatial limiter 104, an L/R limiter 106, an M/S to L/R converter 108, and a controller 110. The L/R to M/S converter 102 receives the left input channel 112 and the right input channel 114, and generates the mid component 116 and the side component 118 from the input channels 112, 114. In some embodiments, the mid component 116 may be generated based on a sum of the left input channel 112 and the right input channel 114. The side component 118 may be generated based on a difference between the left input channel 112 and the right input channel 114. The mid and side components may be generated in other ways, such as using various L/R to M/S transformations. In some embodiments, mid and side components are generated from a multichannel (e.g., surround sound) audio signal.

The spatial limiter 104 includes a mid gain processor 152 and a side gain processor 154. The mid gain processor 152 receives the mid component 116 and the side component 118, and determines a mid gain factor $\alpha_m$ for the mid component 116. The mid gain processor 152 applies the mid gain factor $\alpha_m$ to the mid component 116 to generate an adjusted mid component 120. The side gain processor 154 receives the mid component 116 and the side component 118, and determines a side gain factor $\alpha_s$ for the side component 118. The side gain processor 154 applies the side gain factor $\alpha_s$ to the side component 118 to generate an adjusted side component 122.

In some embodiments, there is a priority of spatial limiting between the mid component 116 and the side component 118. For example, a primary gain factor $\alpha_I$ is applied to the higher priority component down to a gain reduction budget for the higher priority component. If the gain reduction budget is exhausted, but the left-right threshold $\vartheta_{LR}$ fails to be satisfied, then a secondary gain factor $\alpha_{II}$ is applied to the lower priority component down to a gain reduction budget for the lower priority component. If the primary component is the mid component and the secondary component is the side component, then the mid gain factor $\alpha_m$ is defined by $\alpha_I$ and the side gain factor $\alpha_s$ is defined by $\alpha_{II}$. If the primary component is the side component and the secondary component is the mid component, then the mid gain factor $\alpha_m$ is defined by $\alpha_{II}$ and the side gain factor $\alpha_s$ is defined by $\alpha_I$. The gain factor for the lower priority component is defined recursively using the gain factor for the higher priority component to specify the priority. If the left-right threshold $\vartheta_{LR}$ remains unsatisfied after application of the gain factor for the lower priority component, then a left-right gain factor $\alpha_{lr}$ is applied to each of the mid and side components as needed to satisfy the left-right threshold $\vartheta_{LR}$.

The L/R limiter 106 includes an L/R gain processor 156. The L/R gain processor 156 receives the adjusted mid component 120 and the adjusted side component 122 as adjusted by the spatial limiter 104, applies the left-right gain factor $\alpha_{lr}$ to the adjusted mid component 120 to generate the adjusted mid component 124, and applies the left-right gain factor $\alpha_{lr}$ to the side component 122 to generate the adjusted side component 126.

As discussed in greater detail below in connection with FIGS. 3A through 9, the gain factors $\alpha_m$, $\alpha_s$, and $\alpha_{lr}$ may vary depending on the priority of spatial limiting of the audio processing system 100. The priority for spatial limiting defines a priority between the mid and side limiting stages. If either the mid or side gain reduction calculations are constrained, e.g. with gain budgets or side chain processing, they may be followed by a L/R limiting stage that is applied to both the mid and side components. This L/R limiting stage affects both components equally and therefore may be determined and applied in mid-side space or in the left-right space. Lower prioritized limiting stages may apply a gain factor that is defined using one or more gain factors applied in higher prioritized limiting stages. Each higher priority limiting stage may include a gain reduction budget θ that defines a minimum value for the gain factor, with lower priority limiting stages being used when the gain reduction budget is exhausted for the higher priority limiting stage and the left-right threshold $\vartheta_{LR}$ fails to be satisfied. In each configuration, there is application of at least one gain factor to the mid component and at least one gain factor to the side component to ensure that peaks of the left channel 132 and right channel 134 of the output audio signal in left-right space are below the left-right threshold $\vartheta_{LR}$. It should be noted that these stages may not actually separate, nor are they necessarily recursive in nature. The separate stages may merely represent logical priority. The embodiments discussed herein are not limited to use or omission of recursive gain stage calculations, or operation via separate dynamic range controllers for each stage.

The M/S to L/R converter 108 receives the adjusted mid component 124 and the adjusted side component 126, and generates the left output channel 132 and the right output channel 134 from the adjusted mid component 124 and the adjusted side component 126. In some embodiments, the left output channel 132 may be generated based on a sum of the adjusted mid component 124 and the adjusted side component 126. The right output channel 134 may be generated based on a difference between the adjusted mid component 124 and the adjusted side component 126. Other types of transformations may be used to generate left and right channels from mid and side components. The M/S to L/R converter 108 outputs the left output channel 132 to a left speaker and the right output channel 134 to a right speaker. As a result of the processing applied by the spatial limiter 104 and the L/R limiter 106, the peaks of the left channel 132 and right channel 134 of the output audio signal are below the left-right threshold $\vartheta_{LR}$.

In some embodiments, the controller 110 controls the operations of the audio processing system 100. The controller 110 may be coupled to the spatial limiter 104 and the L/R to configure operation of the spatial limiter 104, such as definition of thresholds (e.g., $\vartheta_{LR}$, gain reduction budgets, etc.), determination of priority of processing stages, and determination of gain factors in accordance with the determined priority and thresholds. The various parameters used by the spatial limiter may be defined by user input, programmatically, or combinations thereof as discussed in greater detail herein.

Example Spatial Limiter

Figure 2:
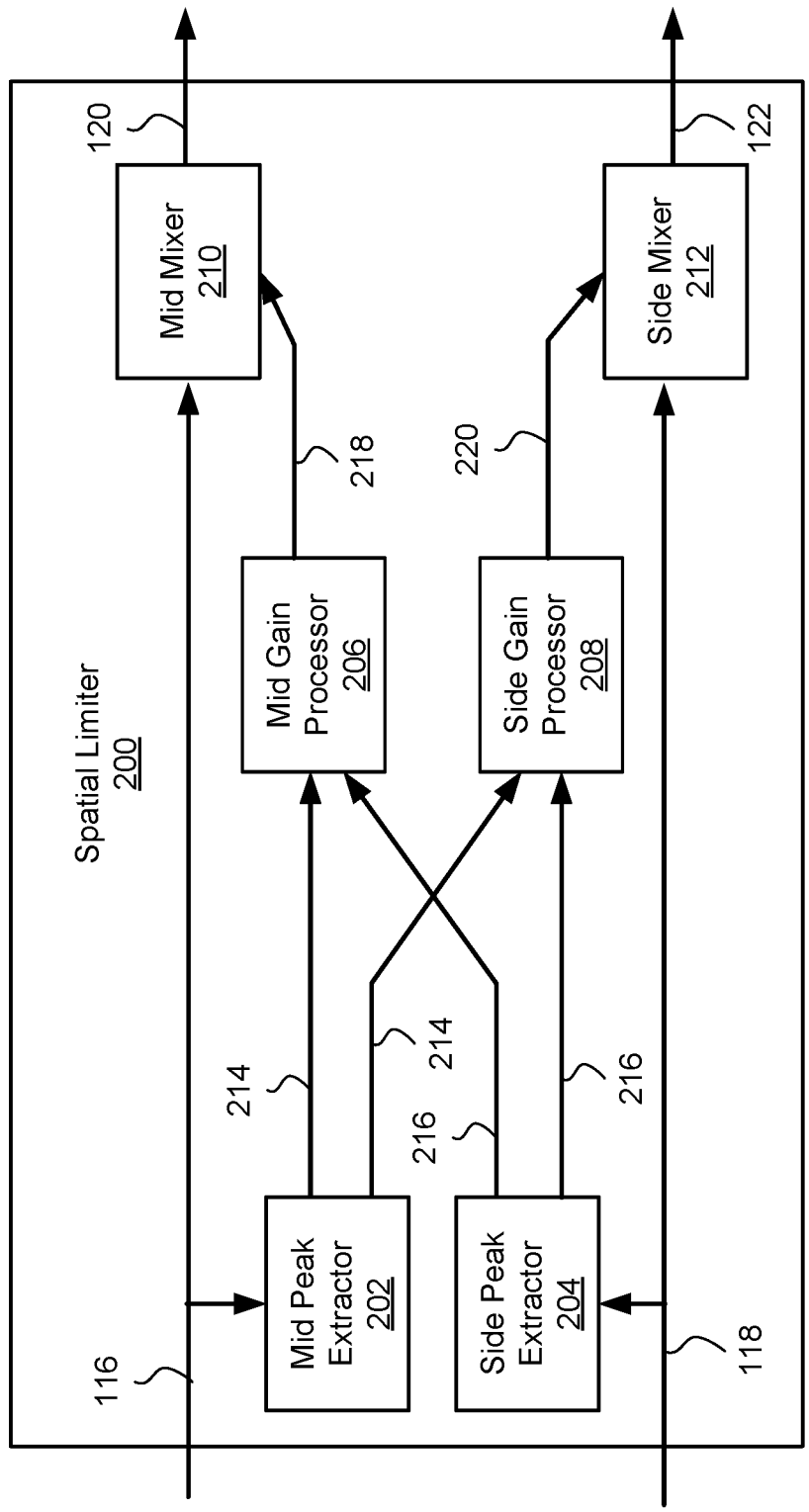
FIG. 2 is a schematic block diagram of a spatial limiter, in accordance with some embodiments.

FIG. 2 is a schematic block diagram of a spatial limiter 200, in accordance with some embodiments. The spatial limiter 200 includes a mid peak extractor 202, a side peak extractor 204, a mid gain processor 206, a side gain processor 208, a mid mixer 210, and a side mixer 212.

The mid peak extractor 202 receives the mid component 116, and determines a mid peak 214 representing a peak value of the mid component 116. The mid peak extractor 202 provides the mid peak 214 to the mid gain processor 206 and the side gain processor 208. The side peak extractor 204 receives the side component 118, and determines a side peak 216 representing a peak value of the side component 118. The side peak extractor 204 provides the side peak 216 to the mid gain processor 206 and the side gain processor 208.

The mid gain processor 206 determines a mid gain factor 218 ($\alpha_m$) based on the mid peak 214, the side peak 216, the threshold $\vartheta_{LR}$ in left-right space. The side gain processor 208 determines a side gain factor 220 ($\alpha_s$) based on the mid peak 214, the side peak 216, the threshold $\vartheta_{LR}$ in left-right space.

The mid mixer 210 receives the mid component 116 and the mid gain factor 218 ($\alpha_m$), and multiplies these values to generate the adjusted mid component 120. The side mixer 212 receives the side component 118 and the side gain factor 220 ($\alpha_s$), and multiplies these values to generate the adjusted side component 122.

In some embodiments, the L/R limiting stage is integrated with the spatial limiter 200. The mid gain processor 206 combines the left-right gain factor $\alpha_{lr}$ with the mid gain factor 218, and mid mixer 210 multiplies the result with the mid component 116 to generate the adjusted mid component 124. The side gain processor 208 combines the left-right gain factor $\alpha_{lr}$ with the side gain factor 220, and side mixer 212 multiplies the result with the side component 118 to generate the adjusted side component 126.

Left-Right Space to Mid-Side Space Coordinate Transformation

Gain application may be applied to one of the mid component 116 or the side component 118 of the input audio signal. To create the mid component 116 and side component 118, a transformation M for converting a signal from left-right space to mid-side space may be defined by Equation 1:

$$M = \begin{bmatrix} 1 & 1 \\ 1 & -1 \end{bmatrix} \frac{1}{2} \qquad \text{Eq. (1)}$$

In mid-side space, various processing may be performed including subband spatial processing, crosstalk processing (e.g., crosstalk cancellation or crosstalk simulation), crosstalk compensation (e.g., adjusting for spectral artifacts caused by crosstalk processing), and gain application in the mid or side components. Processed mid and side components are converted to the left-right space as a left output channel for a left speaker and a right output channel for a right speaker.

The inverse transformation $M^{-1}$ for converting a signal from mid-side space to left-right space may be defined by Equation 2:

$$M^{-1} = \begin{bmatrix} 1 & 1 \\ 1 & -1 \end{bmatrix} \qquad \text{Eq. (2)}$$

The left-right space and mid-side space are examples of orthogonal audio coordinate systems. In practice, equations 1 and 2 may be preferred to the true orthogonal form, where both forward and inverse transformations are scaled by square root of 2 for reduction in computational complexity.

Side (or Mid) to Left-Right Priority Limiting

An audio processing system 100 may perform spatial priority limiting of an audio signal by prioritizing a gain applied to one of the side component $m_2$ or mid component $m_1$, followed by an L/R gain. For example, a left-right threshold $\vartheta_{LR}$ in left-right space is determined that defines a threshold level for the audio signal in left-right space. The left output channel 132 and the right output channel 134 each should not exceed the threshold $\vartheta_{LR}$. To satisfy the threshold $\vartheta_{LR}$, the audio processing system may prioritize gain in the mid-side space between the mid or side component.

To minimize the reduction of the side component, a gain reduction budget $\theta_s$ for the side component may be used. The gain reduction budget $\theta_s$ defines a maximum amount of gain reduction that can be applied to the side component, and is used to determine a gain factor $\alpha_s$ for the side component. A left-right gain factor $\alpha_{lr}$ is determined based on the gain factor $\alpha_s$. Application of the side gain factor $\alpha_s$ to the side component, and a left-right gain factor $\alpha_{lr}$ to both the mid and side component results in satisfaction of the threshold $\vartheta_{LR}$ for the audio signal.

After the determination of the gain factor $\alpha_s$, $\alpha_s$ is applied to the side component. The left-right gain factor $\alpha_{lr}$ is applied to each of the mid component and the side component (or each of the left and right channel after conversion to left-right space, since the same global scale factor could be applied to any orthogonal rotation of coordinates with the identical result). Here, there is a prioritization of gain control for the side component to satisfy the threshold $\vartheta_{LR}$ down to the side gain reduction budget $\theta_s$. If the gain reduction budget $\theta_s$ is applied to the side component but the threshold $\vartheta_{LR}$ fails to be satisfied, then the suitable $\alpha_{lr}$ is applied to both the mid component and side component. This results in satisfaction of the threshold $\vartheta_{LR}$ using gain factors determined in the mid-side space.

To prioritize gain control for the side component $m_2$ down to a side gain reduction budget $\theta_s$, the gain factor $\alpha_s$ applied to the side component $m_2$ can be defined by Equation 3:

$$\alpha_s = \max\left(\theta_s, \min\left(\frac{\vartheta_{LR} - |m_1|}{|m_2|}, 1\right)\right) \qquad \text{Eq. (3)}$$

where $|m_1|$ is the peak of the mid component $m_1$, and $|m_2|$ is the peak of the side component $m_2$.

The left-right gain factor $\alpha_{lr}$ may be defined recursively using the side gain factor $\alpha_s$. The left-right gain factor $\alpha_{lr}$ is defined by Equation 4:

$$\alpha_{LR} = \min\left(\frac{\vartheta_{LR}}{P_{LR}}, 1\right) \qquad \text{Eq. (4)}$$

where $P_{LR}$ is a worst-case peak in left-right space after application of the side gain factor $\alpha_s$ to the side component $m_2$.

$P_{LR}$ may be defined by Equation 5:

$$P_{LR} = [|m_1| \; |m_2|]\begin{bmatrix} 1 \\ \alpha_S \end{bmatrix} \qquad \text{Eq. (5)}$$

Once the gain coefficients $\alpha_s$ and $\alpha_{lr}$ are determined, they are applied to the mid component $m_1$ and the side component $m_2$ as shown by Equation 6:

$$m' = [m_1 \; m_2]\begin{bmatrix} 1 & 0 \\ 0 & \alpha_S \end{bmatrix}\begin{bmatrix} \alpha_{lr} & 0 \\ 0 & \alpha_{lr} \end{bmatrix} \qquad \text{Eq. (6)}$$

The inverse transformation as defined by Equation 2 may then be applied to the result of Equation 6 to produce the left output channel 132 and right output channel 134, each satisfying the left-right threshold $\vartheta_{LR}$.

Note that in Equation 3, if $\alpha_s=0$ for a given peak, this will completely collapse the soundstage to mono. However, we can mitigate this effect by specifying a non-zero value for $\theta_s$. There will be some component of peak limiting applied to both side and mid components via $\alpha_{lr}$ if the budget $\theta_s$ is exhausted in the side component, or there is clipping in the mid channel.

Figure 3A:
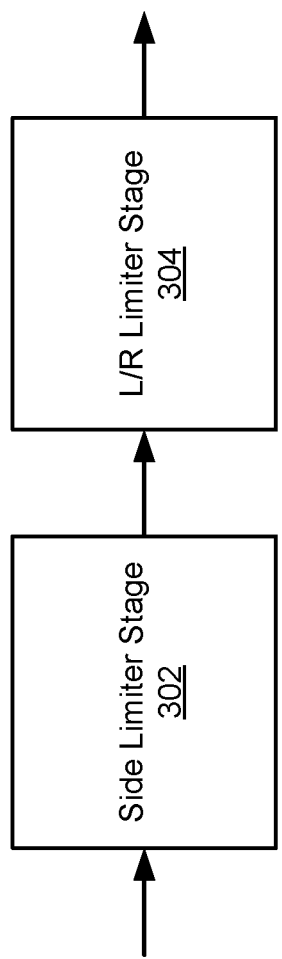
FIG. 3A is a block diagram of a side channel gain application followed by a L/R gain application, in accordance with some embodiments.
Figure 3B:
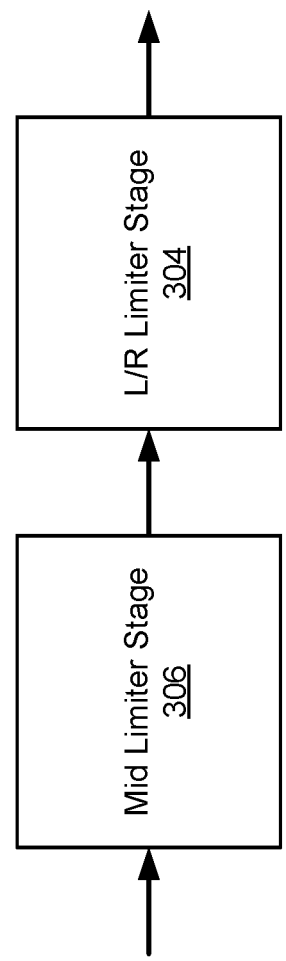
FIG. 3B is a block diagram of a mid channel gain application followed by a L/R gain application, in accordance with some embodiments.

Equations 3 through 6 imply a priority of gain reduction stages as shown in FIG. 3A, where first there is a side limiter stage 302, and then a left-right limiter stage 304. An analogous form of processing could be applied to the mid component $m_1$ as shown in FIG. 3B, where first there is a mid limiter stage 306, and then a left-right limiter stage 304. Here, algorithmic control of the mid component is achieved using a gain reduction budget $\theta_m$ to define a mid gain factor $\alpha_m$, along with use of a left-right gain factor $\alpha_{lr}$ as needed to satisfy the threshold $\vartheta_{LR}$ after application of the mid gain factor $\alpha_m$.

To prioritize gain control for the mid component $m_1$ down to a mid gain reduction budget $\theta_m$, the mid gain factor $\alpha_m$ applied to the mid component $m_1$ can be defined by Equation 7:

$$\alpha_m = \max\left(\theta_m, \min\left(\frac{\vartheta_{LR} - |m_2|}{|m_1|}, 1\right)\right) \qquad \text{Eq. (7)}$$

where $|m_1|$ is the peak of the mid component $m_1$, and $|m_2|$ is the peak of the side component $m_2$.

The left-right gain factor $\alpha_{lr}$ may be defined recursively using the mid gain factor $\alpha_m$. The left-right gain factor $\alpha_{lr}$ is defined by Equation 8:

$$\alpha_{LR} = \min\left(\frac{\vartheta_{LR}}{P_{LR}}, 1\right) \qquad \text{Eq. (8)}$$

where $P_{LR}$ is a worst-case peak in left-right space after application of the mid gain factor $\alpha_m$ to the side component $m_1$.

$P_{LR}$ may be defined by Equation 9:

$$P_{LR} = [|m_1| \; |m_2|]\begin{bmatrix} \alpha_m \\ 1 \end{bmatrix} \qquad \text{Eq. (9)}$$

Once the gain coefficients $\alpha_m$ and $\alpha_{lr}$ are determined, they are applied to the mid component $m_1$ and the side component $m_2$ as shown by Equation 10:

$$m' = [m_1 \; m_2]\begin{bmatrix} \alpha_m & 0 \\ 0 & 1 \end{bmatrix}\begin{bmatrix} \alpha_{lr} & 0 \\ 0 & \alpha_{lr} \end{bmatrix} \qquad \text{Eq. (10)}$$

The inverse transformation as defined by Equation 2 may then be applied to the result of Equation 10 to produce the left output channel and right output channel, each satisfying the left-right threshold $\vartheta_{LR}$.

Parallel Mid and Side to Left-Right Priority Limiting

Figure 4:
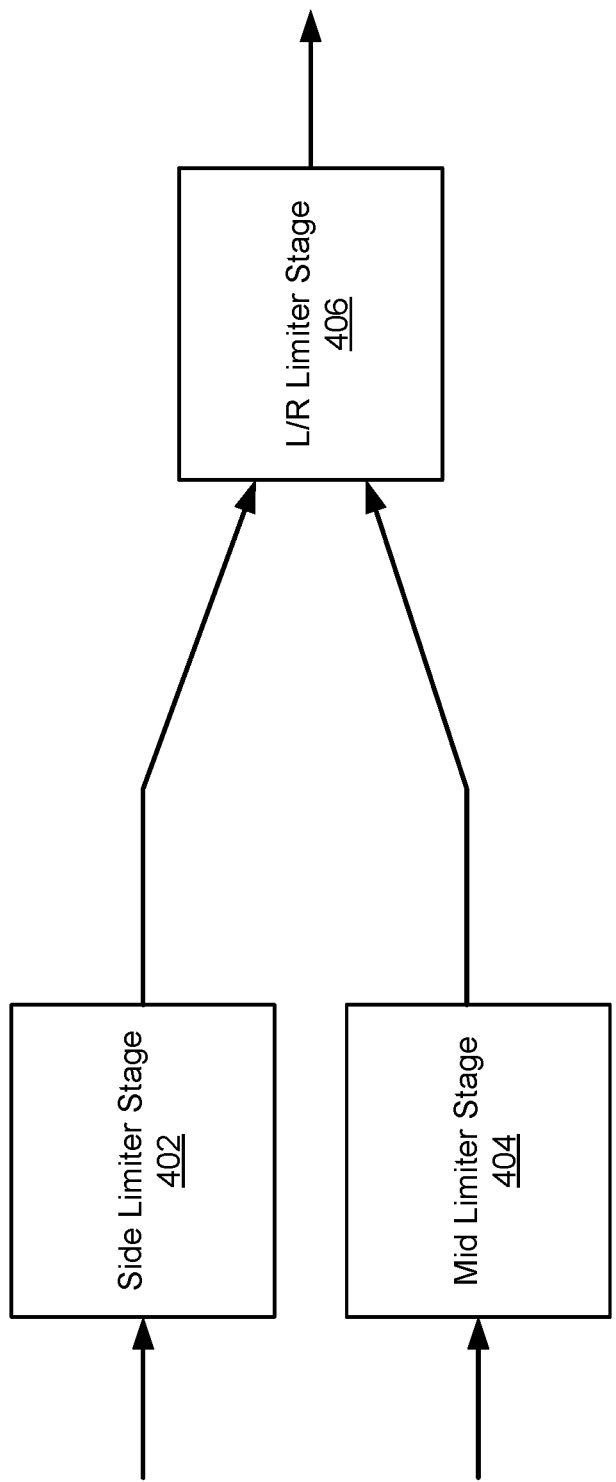
FIG. 4 is a block diagram of a mid channel gain application and a side channel gain application in parallel, followed by an L/R gain application, in accordance with some embodiments.

The audio processing system 100 may use a parallel (flat) priority between the mid and side component, while still prioritizing the gain coefficients $\alpha_m$ and $\alpha_s$ above the left-right gain factor $\alpha_{lr}$. The priority of gain reduction stages is shown in FIG. 4, where first there is a side limiter stage 402 in parallel with a mid limiter stage 404, and an L/R limiter stage 406 following the parallel stages 402 and 404.

In this case, a side gain reduction budget $\theta_s$ and a mid gain reduction budget $\theta_m$ are both used. The side gain factor $\alpha_s$ can be determined using Equation 3, and the mid gain factor $\alpha_m$ can be determined using Equation 7. Here, the definition for the side and mid gain factors are independent because of the parallel priority for the mid and side components.

The left-right gain factor $\alpha_{lr}$ is defined using the mid gain factor $\alpha_m$ and the side gain factor $\alpha_s$. The left-right gain factor $\alpha_{lr}$ is defined by the Equation 8 shown above, and where the worst-case peak $P_{LR}$ is defined Equation 11:

$$P_{LR} = [|m_1| \; |m_2|]\begin{bmatrix} \alpha_m \\ \alpha_s \end{bmatrix} \quad \text{Eq. (11)}$$

Once the gain coefficients $\alpha_m$, $\alpha_s$, and $\alpha_{lr}$ are determined, they are applied to the mid component $m_1$ and the side component $m_2$ as shown by Equation 12:

$$m' = [m_1 \; m_2]\begin{bmatrix} \alpha_m & 0 \\ 0 & \alpha_s \end{bmatrix}\begin{bmatrix} \alpha_{lr} & 0 \\ 0 & \alpha_{lr} \end{bmatrix} \quad \text{Eq. (12)}$$

Note that $\alpha_m$ might be permitted in this configuration to vanish to 0 to keep the output $|m'| \leq \vartheta_{LR}$, assuming $\theta_m = 0$. This means that although this additional stage has prevented the mid channel information from clipping, the resulting soundstage still can reduce perceptually to mono. Providing a lower bound on $\alpha_m$, would solve this issue, but would result in an incomplete gain reduction strategy, as our gain reduction budget is now finite, consisting of 20 log 10 ($\theta_s$)+20 log 10 ($\theta_m$). As such, the calculation and application of $\alpha_{lr}$ is used to ensure satisfaction of the left-right threshold $\vartheta_{LR}$.

Serial Side, Mid, and Left-Right Priority Limiting

The audio processing system may use a series priority relationship between mid and side stages, followed by the L/R limiter stage. As shown in FIG. 5A, first there is a side limiter stage 502 so that the side component $m_2$ is the primary component for limiting, then a mid limiter stage 504 so that the mid component $m_1$ is the secondary component for limiting, then a L/R limiter stage 506. In another example shown in FIG. 5B, first there is a mid limiter stage 504 so that the mid component $m_1$ is the primary component for limiting, then a side limiter stage 502 such that the side component $m_2$ is the secondary component for limiting, then a L/R limiter stage 506. It is noted that the stages 502, 504, and 506 are not necessarily separate processing stages and may represent only logical priority. Put another way, all gain reductions may be calculated simultaneously with different gain factors being used based on the logical priority. Recursive gain stage calculations may be used when gain factors are applied in separate stages.

In either case, let $m_I$ designate a primary component (either mid component $m_1$ or side component $m_2$) and $m_{II}$ designate a secondary component (the other one of the mid component $m_1$ or side component $m_2$). The audio processing system may determine the priority order between the mid and side component, either programmatically or based on user input, with the higher priority component being designated as the primary component $m_I$ and the lower priority component being designated as the secondary component $m_{II}$.

A primary gain factor $\alpha_I$ is applied to the primary component $m_I$ and a secondary gain factor $\alpha_{II}$ is applied to the secondary component $m_{II}$. The secondary gain factor $\alpha_{II}$ is defined recursively to the primary gain factor $\alpha_I$ to specify the priority. This is shown by Equation 13 for the primary gain factor $\alpha_I$ and Equation 14 for the secondary gain factor $\alpha_{II}$:

$$\alpha_I = \max\left(\theta_I, \min\left(\frac{\vartheta_{LR} - |m_{II}|}{|m_I|}, 1\right)\right) \quad \text{Eq. (13)}$$

$$\alpha_{II} = \max\left(\theta_{II}, \min\left(\frac{\vartheta_{LR} - |m_I| * \alpha_I}{|m_{II}|}, 1\right)\right) \quad \text{Eq. (14)}$$

where $|m_I|$ is the peak of the primary component $m_I$, $|m_{II}|$ is the peak of the secondary component $m_{II}$, $\theta_I$ is the gain reduction budget of the primary component $m_I$, and $\theta_{II}$ is the gain reduction budget of the secondary component $m_{II}$.

The left-right gain factor $\alpha_{lr}$ may be defined recursively using the mid gain factor $\alpha_m$ and the side gain factor $\alpha_s$. If the primary component is the mid component and the secondary component is the side component, then the mid gain factor $\alpha_m$ is defined by $\alpha_I$ and the side gain factor $\alpha_s$ is defined by $\alpha_{II}$. If the primary component is the side component and the secondary component is the mid component, then the mid gain factor $\alpha_m$ is defined by $\alpha_{II}$ and the side gain factor $\alpha_s$ is defined by $\alpha_I$. The left-right gain factor $\alpha_{lr}$ is defined by Equation 15:

$$\alpha_{LR} = \min\left(\frac{\vartheta_{LR}}{P_{LR}}, 1\right) \quad \text{Eq. (15)}$$

where $P_{LR}$ is defined by Equation 16:

$$P_{LR} = [|m_1| \; |m_2|]\begin{bmatrix} \alpha_m \\ \alpha_s \end{bmatrix} \quad \text{Eq. (16)}$$

Once the gain coefficients $\alpha_m$, $\alpha_s$, and $\alpha_{lr}$ are determined, they are applied to the mid component $m_1$ and the side component $m_2$ as shown by Equation 17:

$$m' = [m_1 \; m_2]\begin{bmatrix} \alpha_m & 0 \\ 0 & \alpha_s \end{bmatrix}\begin{bmatrix} \alpha_{lr} & 0 \\ 0 & \alpha_{lr} \end{bmatrix} \quad \text{Eq. (17)}$$

In some embodiments, the L/R limiting stage 506 is integrated with each of the side limiting stage 502 and the mid limiting stage 504. The L/R limiter could use either a nontrivial gain reduction budget or side chain processing, with the associated risk of possible overshoot. To control these cases where overshoot might become problematic, such an embodiment would require an additional L/R limiter stage at the end of the signal path.

Control Signal Smoothing

The gain control equations described above pertain to instantaneous gain values. If these values are applied sample-by-sample without smoothing, the result will effectively be controlled hard-clipping in the appropriate subspace. The resulting artifacts are essentially high frequency modulation of the gain-control function. To reduce these artifacts, a nonlinear low-pass filter can limit the slope of the gain-control function. In cases where a totally causal gain control response is desired, the downward clamping could occur immediately, but upward movement is restricted to some maximum slope. In cases where it is possible to look ahead in a control buffer, a maximally negative downward slope limit (determined by the lookahead length) may be applied and still hit the target control gain at the appropriate peak value. Either variant shifts the artifacts to the transient stage of musical sounds, where they are perceptually masked, and simultaneously reduces their bandwidth.

Example Processes

FIG. 6 is a flow chart of a process 600 for spatially limiting an audio signal, in accordance with some embodiments. The process 600 provides for limiting the audio signal below a threshold $\vartheta_{LR}$ in left-right space by gain adjusting mid and side components of the audio signal. The process 600 may have fewer or additional steps, and steps may be performed in different orders.

An audio processing system (e.g., L/R to M/S converter 102) generates 605 a mid component and a side component from an audio signal including a left channel and a right channel. The mid component and side component may be determined as defined in Equation 1. The mid component and side component represent the audio signal in mid-side space, and left channel and the right channel represent the audio signal in left-right space. The mid component may include a sum of the left channel and the right channel. The side component may include a difference between the left channel and the right channel.

The audio processing system (e.g., spatial limiter 104 or controller 110) determines 610 a left-right threshold. The left-right threshold $\vartheta_{LR}$ defines a maximum level that is allowed for each of the left right channels. For example, neither the absolute value of the left channel nor the absolute value of the right channel should exceed the left-right threshold $\vartheta_{LR}$. The threshold $\vartheta_{LR}$ may be defined by user input, or programmatically. As discussed in greater detail below, gain reduction is applied to the audio signal in mid-side space to ensure that the peaks of the left channel and the right channel are below the threshold $\vartheta_{LR}$.

The audio processing system (e.g., spatial limiter 104 and/or L/R limiter 106) applies 615 one or more gain factors to each of the mid component and the side component to generate an adjusted mid component and an adjusted side component. In one example, the one or more gain factors for the mid component may include a mid gain factor that is applied to the mid component, and an L/R gain factor that is applied to each of the mid component and the side component. The one or more gain factors for the side component may include a side gain factor that is applied to the side component, and the L/R gain factor. The one or more gain factors that are used for each component may depend on a priority of spatial limiting between the mid component and the side component, with the gain factor for the lower priority component being defined recursively using the higher priority component. Similarly, the L/R gain factor may be defined recursively using the gain factors for the mid and/or side components. Additional details regarding gain factors for different priorities for spatial limiting are discussed below in connection with FIGS. 7, 8 and 9.

The audio processing system (e.g., M/S to L/R converter 108) generates 620 a left output channel and a right output channel from the adjusted mid component and the adjusted side component. The left and right output channels are each limited below the left-right threshold from the one or more gain factors applied to each of the mid component and the side component.

FIG. 7 is a flow chart of a process 700 for spatially limiting an audio signal using side (or mid) limiting followed by left-right limiting, in accordance with some embodiments. The process 700 may be performed at step 615 for the process 600 to implement the priority of gain reduction stages shown in FIG. 3A or FIG. 3B. In FIG. 3A, the side component is a selected component for limiting, and the mid component is a non-selected component for limiting. In FIG. 3B, the mid component is the selected component, and the side component is the non-selected component. The process 700 may have fewer or additional steps, and steps may be performed in different orders.

The audio processing system (e.g., spatial limiter 104 or controller 110) determines 705 a priority for spatial limiting between the mid component and the side component defining one of the mid component or the side component as a selected component, and another one of the mid component or the side component as a secondary component. The priority for the spatial limiting may be determined programmatically, or based on user input.

The audio processing system (e.g., spatial limiter 104 or controller 110) determines 710 a gain factor for the selected component. For example, the gain factor may be defined by Equation 3 when the side component is the selected component, or the gain factor may be defined by Equation 7 when the mid component is the selected component. In either case, the gain factor is defined down to a gain reduction budget θ.

The audio processing system (e.g., spatial limiter 104) applies 715 the gain factor for the selected component to the selected component. The selected component may be multiplied by the gain factor.

The audio processing system (e.g., L/R limiter 106 or controller 110) determines 720 a left-right gain factor for the selected component and the non-selected component using the gain factor for the selected component. If the selected component is the side component, then the left-right gain factor $\alpha_{lr}$ may be determined using Equations 4 and 5. If the selected component is the mid component, then the left-right gain factor $\alpha_{lr}$ may be determined using Equations 8 and 9.

The audio processing system (e.g., L/R limiter 106) applies 725 the left-right gain factor to the selected component to generate an adjusted selected component and to the non-selected component to generate an adjusted non-selected component. The adjusted selected and non-selected components, one being the adjusted mid component and the other being the adjusted side component, may be used to generate the left and right output channels.

FIG. 8 is a flow chart of a process 800 for spatially limiting an audio signal using parallel side and mid limiting followed by left-right limiting, in accordance with some embodiments. The process 800 may be performed at step 615 for the process 600 to implement the priority of gain reduction stages shown in FIG. 4. The process 800 may have fewer or additional steps, and steps may be performed in different orders.

The audio processing system (e.g., spatial limiter 104 or controller 110) determines 805 a priority for spatial limiting between the mid component and the side component defining the mid and side components as equal priority components. The priority for the spatial limiting may be determined programmatically, or based on user input.

The audio processing system (e.g., spatial limiter 104 or controller 110) determines 810 a mid gain factor for the mid component. For example, mid gain factor may be defined by Equation 7, where the mid gain factor is defined down to a gain reduction budget $\theta_m$.

The audio processing system (e.g., spatial limiter 104) applies 815 the mid gain factor to the mid component. The mid component may be multiplied by the mid gain factor.

The audio processing system (e.g., spatial limiter 104) determines 820 a side gain factor for the side component.

For example, the side gain factor may be defined by Equation 7, where the side gain factor is defined down to a gain reduction budget $\theta_s$.

The audio processing system (e.g., spatial limiter 104) applies 825 the side gain factor to the side component. The side component may be multiplied by the side gain factor.

The audio processing system (e.g., L/R limiter 106 or controller 110) determines 830 a left-right gain factor for the mid component and the side component recursively using the mid gain factor and the side gain factor. The left-right gain factor $\alpha_{lr}$ may be determined using the mid gain factor $\alpha_m$ and the side gain factor $\alpha_s$ as defined by Equations 8 and 11.

The audio processing system (e.g., L/R limiter 106) applies 835 the left-right gain factor to the mid component to generate the adjusted mid component and to the side component to generate the adjusted side component. The adjusted mid and side components may be used to generate the left and right output channels.

FIG. 9 is a flow chart of a process 900 for spatially limiting an audio signal using serial side, mid, and left-right limiting, in accordance with some embodiments. The process 900 may be performed at step 615 for the process 600 to implement the priority of gain reduction stages shown in FIG. 5A or FIG. 5B. In FIG. 5A, the side component is a primary component for limiting having higher priority, and the mid component is a secondary component for limiting having lower priority than the primary component. In FIG. 5B, the mid component is the primary component, and the side component is the secondary component. The process 900 may have fewer or additional steps, and steps may be performed in different orders.

The audio processing system (e.g., spatial limiter 104 or controller 110) determines 905 a priority for spatial limiting between the mid component and the side component defining one of the mid component or the side component as a primary component, and another one of the mid component or the side component as a secondary component. The priority for the spatial limiting may be determined programmatically, or based on user input.

The audio processing system may further determine one or more parameters for the spatial limiting. For example, the primary gain reduction budget $\theta_I$ and the secondary gain reduction budget $\theta_{II}$ may be determined either programmatically or from user input.

The audio processing system (e.g., mid gain processor 152 or side gain processor 154) determines 910 a primary gain factor for the primary component. The primary gain factor $\alpha_I$ may be defined by Equation 13. Here, the peak of the primary component $|m_I|$ is determined from $m_I$, and the peak of the secondary component $|m_{II}|$ is determined from $m_{II}$. The peak of the secondary component $|m_{II}|$ is subtracted from the threshold $\vartheta_{LR}$, and divided by the peak of the primary component $|m_I|$ to determine a result. The minimum value between the result and 1 is determined. The primary gain factor $\alpha_I$ is determined from a maximum value between the result and the primary gain reduction budget $\theta_I$.

The audio processing system (e.g., the mid gain processor 152 or side gain processor 154) applies 915 the primary gain factor to the primary component. For example, the primary gain factor $\alpha_I$ may be multiplied with the primary component $m_I$.

The audio processing system (e.g., the other one of the mid gain processor 152 or side gain processor 154) determines 920 a secondary gain factor for the secondary component recursively using the primary gain factor. The secondary gain factor is defined using the primary gain factor to implement the serial priority for spatial limiting between the mid and side components of the audio signal.

The secondary gain factor $\alpha_{II}$ may be defined by Equation 14. The peak of the primary component $|m_I|$ is multiplied by the primary gain factor $\alpha_I$, and the result of the multiplication is subtracted from the threshold $\vartheta_{LR}$. The result of the subtraction is divided by the peak of the primary component $|m_I|$ to determine a result. The minimum value between the result and 1 is determined. The secondary gain factor $\alpha_{II}$ is determined from a maximum value between the result and the secondary gain reduction budget $\theta_{II}$.

The audio processing system (e.g., the other one of the mid gain processor 152 or side gain processor 154) applies 925 the secondary gain factor to the secondary component. For example, the secondary gain factor au may be multiplied with the secondary component $m_{II}$.

The audio processing system (e.g., the L/R limiter 106 or controller 110) determines 930 a left-right gain factor for the primary component and the secondary component using the primary gain factor and the secondary gain factor. The left-right gain factor $\alpha_{lr}$ may be defined using the Equations 15 and 16. In the Equation 15, the left-right threshold $\vartheta_{LR}$ is divided by the worst-case peak in left-right space $P_{LR}$, and the left-right gain factor $\alpha_{lr}$ is determined as a minimum value between the result of the division and 1. In the Equation 16, the $P_{LR}$ is determined by multiplying the peak of the mid component $|m_1|$ by the mid gain factor $\alpha_m$, multiplying the peak of the side component $|m_2|$ by the side gain factor $\alpha_s$, and adding the results of the multiplications. One of the gain factors $\alpha_m$ or $\alpha_s$ may be the primary gain factor au, and the other one of the gain factors $\alpha_m$ or $\alpha_s$ may be the secondary gain factor au, depending on order of priority between the mid and side components.

The audio processing system (e.g., the L/R limiter 106) applies 935 the left-right gain factor to the primary component to generate an adjusted primary component, and the left-right gain factor to the secondary component to generate an adjusted secondary component. For example, the left-right gain factor $\alpha_{lr}$ is multiplied with the primary component (as may be modified by the spatial limiter 140) to generate the adjusted primary component. The left-right gain factor $\alpha_{lr}$ is multiplied with the secondary component (as may be modified by the spatial limiter 104) to generate the adjusted secondary component. The adjusted primary and secondary components may be used to generate the left and right output channels.

FIG. 10 is a flow chart of a process 1000 for controlling audio signal components in one audio coordinate system to achieve a constraint defined in another audio coordinate system, in accordance with some embodiments. The process 1000 is a generalization of the processes 600 through 900 shown in FIGS. 6 through 9, respectively, where an amplitude threshold can be defined in either the mid-side audio coordinate system or the left-right audio coordinate system, and gain factors are applied to components in the other audio coordinate system to satisfy the amplitude threshold. The process 1000 may have fewer or additional steps, and steps may be performed in different orders.

An audio processing system generates 1005 a first component and a second component in a first audio coordinate system from a third component and a fourth component of the audio signal in a second audio coordinate system. In one example, the first audio coordinate system is a mid-side audio coordinate system, the first component is a mid component, and the second component is a side component. The second audio coordinate system is the left-right audio coordinate system, the third component is a left component, and the fourth component is a right component. In another example, the first audio coordinate system is left-right audio coordinate system, the first component is a left component, and the second component is a right component. The second audio coordinate system is the mid-side audio coordinate system, the third component is a mid component and the fourth component is a side component. Conversion between audio coordinate systems may be performed by an L/R to M/S converter 102 or an M/S to L/R converter 108, as shown in FIG. 1.

The audio processing system determines 1010 an amplitude threshold in the second audio coordinate system defining a maximum level for each of the third component and the fourth component. If the second audio coordinate system is the left-right audio coordinate system, then the amplitude threshold may be the L-R threshold $\vartheta_{LR}$, defining a maximum level for the left and right components of the audio signal. If the second audio coordinate system is the mid-side audio coordinate system, then the amplitude threshold may be a M-S threshold $\vartheta_{MS}$, defining a maximum level for the mid and side components of the audio signal. As discussed in greater detail below, gain reduction may be applied to the audio signal in second audio coordinate system to ensure that the peaks of the third and fourth components are below the amplitude threshold.

The audio processing system applies 1015 one or more gain factors to each of the first component and the second component to generate an adjusted first component and an adjusted second component in the first audio coordinate system. The one or more gain factors may include one or more first gain factors that are applied to the first component, and one or more second gain factors that are applied to the second component. In some embodiments, a side chain processing may be performed as discussed in greater detail below in connection with FIG. 1. Here, a single gain factor is determined and applied for each of the first and second components.

In some embodiments, the one or more gain factors that are used for each component may depend on a priority of spatial limiting between the first component and the second component, with the gain factor for the lower priority component being defined recursively using the higher priority component. One or more of the gain factors may be constrained by a gain reduction budget. A smoothing function may be applied to reduce artifacts. In the example where the first audio coordinate system is the left-right audio coordinate system, the gain factors may be generated using similar techniques as discussed herein for the gain factors in the mid-side audio coordinate system.

In some embodiments, the audio processing system determines whether the amplitude threshold is satisfied from applying the one or more gain factors to each of the first component and the second component. For example, some or all of the gain factors may include a gain reduction budget. If the gain reduction budget is exhausted but the amplitude threshold fails to be satisfied, a global gain factor (e.g., left-right gain factor $\alpha_{lr}$) may be applied to the audio signal to satisfy the amplitude threshold. The global gain factor may be applied to the first and second components in the first coordinate system, or to the third and fourth components in the second coordinate system.

The audio processing system generates 1020 a first output channel and a second output channel in the second audio coordinate system from the adjusted first component and the adjusted second component. The first and second output channels are each limited below the amplitude threshold from the one or more gain factors applied to each of the first component and the second component. In the example where the second audio coordinate system is the left-right audio coordinate system, the first and second output channels are left and right output channels.

Side Chain Processing

Figure 11:
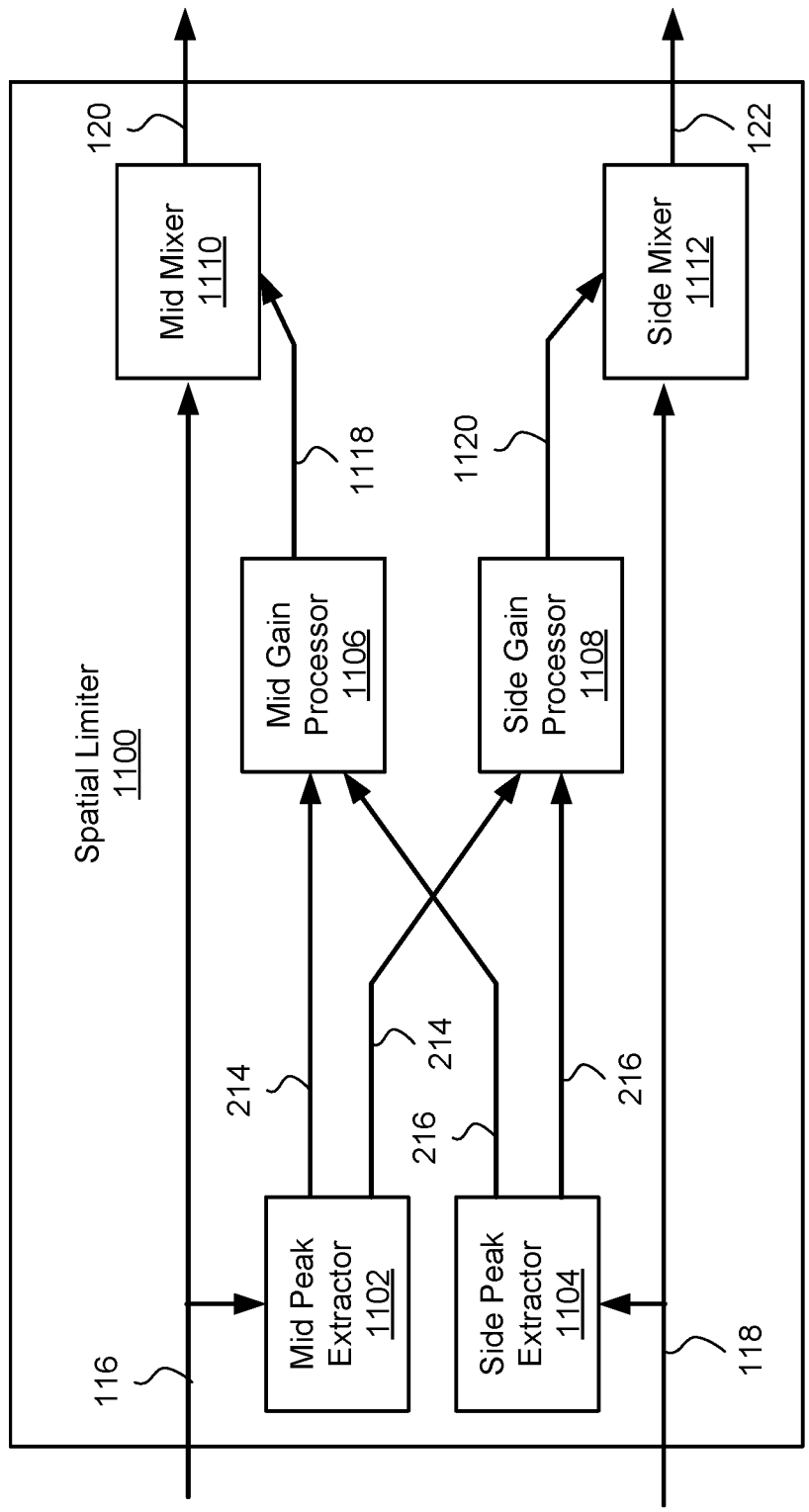
FIG. 11 is a schematic block diagram of a spatial limiter for side chain processing, in accordance with some embodiments.

FIG. 11 is a schematic block diagram of a spatial limiter 1100 for side chain processing, in accordance with some embodiments. The spatial limiter 1100 integrates processing performed on the mid and side components by the various limiter stages shown in FIG. 3A, 3B, 4, 5A, or 5B into a single limiting stage. In that sense, the spatial limiter 1100 may be a component of the audio processing system 100 that operates with L/R to M/S converter 102 and the M/S to L/R converter 108, replacing the two-stage spatial limiter 104 and L/R limiter 106 shown in FIG. 1.

Side chain processing is particularly useful in cases where pumping artifacts caused by low frequencies are present in the cross stages. As popular conventions in audio mixing may include centering the low (e.g., bass) frequencies, the low frequencies of the mid component may need more gain reduction than the low frequencies of the side component.

The spatial limiter 1100 includes a mid peak extractor 1102, a side peak extractor 1104, a mid gain processor 1106, a side gain processor 1108, a mid mixer 1110, and a side mixer 1112.

The mid peak extractor 1102 receives the mid component 116, and determines the mid peak 214 representing a peak value of the mid component 116. The mid peak extractor 1102 provides the mid peak 214 to the mid gain processor 1106 and the side gain processor 1108. The side peak extractor 1104 receives the side component 118, and determines a side peak 216 representing a peak value of the side component 118. The side peak extractor 1104 provides the side peak 216 to the mid gain processor 1106 and the side gain processor 1108.

The mid gain processor 1106 determines a mid gain factor 1118 ($\alpha_m$) based on the mid peak 214, the side peak 216, the threshold $\vartheta_{LR}$ in left-right space. The side gain processor 1108 determines the side gain factor 1120 ($\alpha_s$) based on the mid peak 214, the side peak 216, the threshold $\vartheta_{LR}$ in left-right space.

The side chain processing may incorporate different priorities for limiting the mid or side components based on the calculations used for the mid gain factor $\alpha_m$ and the side gain factor $\alpha_s$. By applying additional side chain processing to the control signals, we may derive the following operator matrix:

$$\begin{bmatrix} MM & MS \\ SM & SS \end{bmatrix}$$

where each entry is an independent operator. The operator matrix provides the ability to prioritize gain control not only based on broadband spatial characteristics, but a vast number of other characteristics, such as frequency content, etc. The entry MM is an operator which defines the control of the mid gain factor $\alpha_m$ by the mid component 214. MS is an operator which defines the control of the side gain factor $\alpha_s$ by the mid component 214. SM is an operator which defines control of the mid gain factor $\alpha_m$ by the side component 216. Finally, SS is an operator which defines control of the side gain factor $\alpha_s$ by the side component 216.

In an example where priority is implemented with side chain processing, the mid gain processor 1106 determines the mid gain factor and the side gain processor 1108 determines the side gain factor $\alpha_s$ using Equations 13 or 14, depending on the desired priority between the mid and side limiting stages, determines the left-right gain factor is using the Equations 15 and 16. The mid gain processor 1106 combines the mid gain factor with the left-right gain factor to generate the mid gain factor 1118. The side gain processor 1106 combines the side gain factor with the left-right gain factor to generate the final mid gain factor 1118.

The mid mixer 1110 receives the mid component 116 and the mid gain factor 1118 ($\alpha_m$), and multiplies these values to generate the adjusted mid component 124. The side mixer 212 receives the side component 118 and the side gain factor 1120 ($\alpha_s$), and multiplies these values to generate the adjusted side component 126. The adjusted mid component 124 and adjusted side component 126 may be used to generate a left output channel 132 and the right output channel 134, such as by the M/S to L/R converter 108 as shown in FIG. 1.

Example Computer

Figure 12:
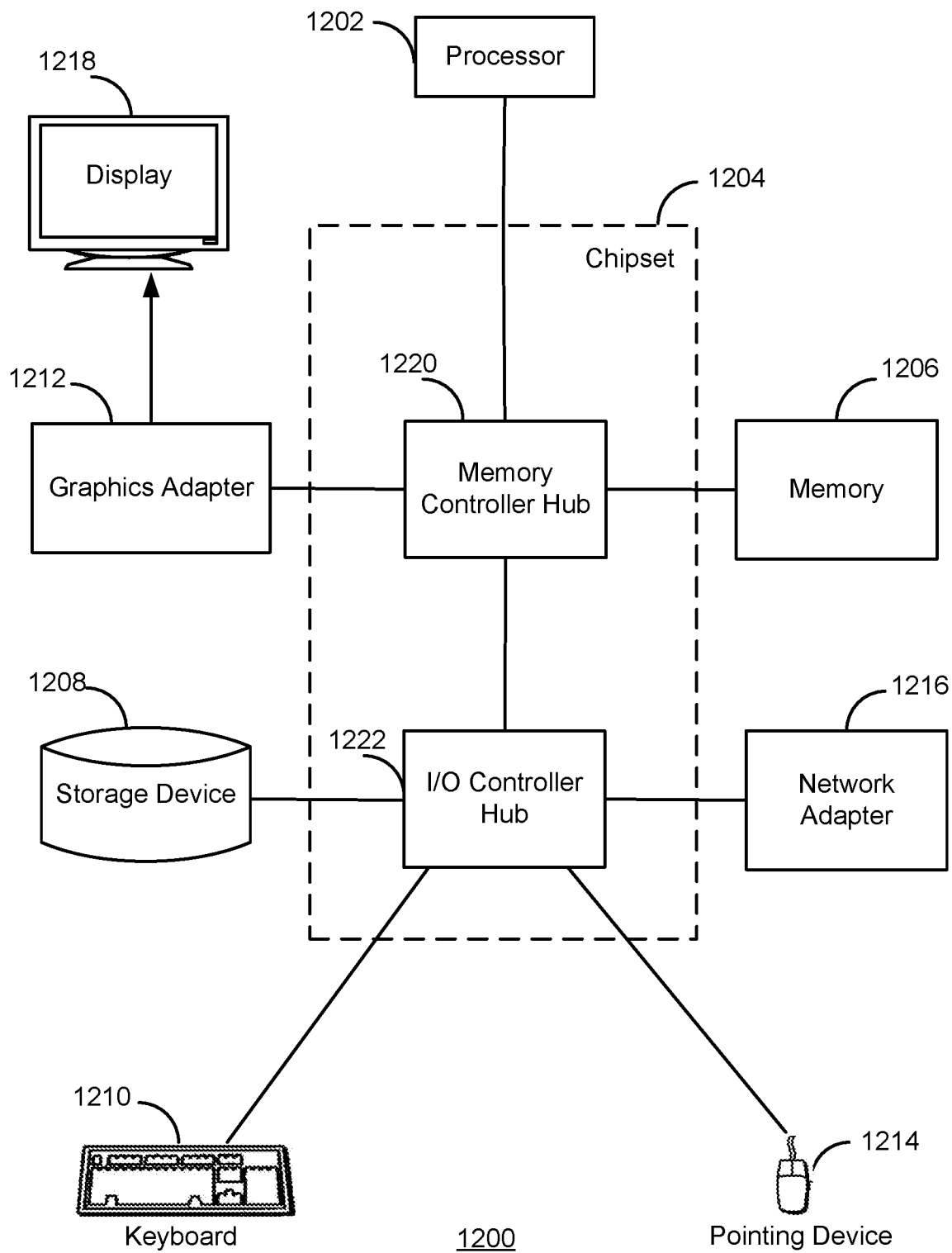
FIG. 12 is a schematic block diagram of a computer system, in accordance with some embodiments.

FIG. 12 is a schematic block diagram of a computer 1200, according to one embodiment. The computer 1200 is an example of circuitry that implements an audio processing system. Illustrated are at least one processor 1202 coupled to a chipset 1204. The chipset 1204 includes a memory controller hub 1220 and an input/output (I/O) controller hub 1222. A memory 1206 and a graphics adapter 1212 are coupled to the memory controller hub 1220, and a display device 1218 is coupled to the graphics adapter 1212. A storage device 1208, keyboard 1210, pointing device 1214, and network adapter 1216 are coupled to the I/O controller hub 1222. The computer 1200 may include various types of input or output devices. Other embodiments of the computer 1200 have different architectures. For example, the memory 1206 is directly coupled to the processor 1202 in some embodiments.

The storage device 1208 includes one or more non-transitory computer-readable storage media such as a hard drive, compact disk read-only memory (CD-ROM), DVD, or a solid-state memory device. The memory 1206 holds program code (comprised of one or more instructions) and data used by the processor 1202. The program code may correspond to the processing aspects described with FIGS. 1 through 11.

The pointing device 1214 is used in combination with the keyboard 1210 to input data into the computer system 1200. The graphics adapter 1212 displays images and other information on the display device 1218. In some embodiments, the display device 1218 includes a touch screen capability for receiving user input and selections. The network adapter 1216 couples the computer system 1200 to a network. Some embodiments of the computer 1200 have different and/or other components than those shown in FIG. 12.

ADDITIONAL CONSIDERATIONS

Some example benefits and advantages of the disclosed configuration include limiting an audio signal in left-right space using gain factors applied in mid-side space to shift artifacts of hard limiting to different spatial locations, and the preferences specified by the user. Processing of mid or side components of audio signals is used in various types of audio processing, and spatial priority limiting as discussed herein provides for more computationally efficient integration with such processing techniques in mid/side space. These preferences are specified, at the lowest level, as thresholds between which the limiter enters different regimes of operation. At a higher level, this can be understood as a trade-off between the artifacts of various sound-stage distortions and the artifacts of traditional peak limiting.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A method for processing an audio signal, comprising:
generating a first component and a second component in a first audio coordinate system from a third component and a fourth component of the audio signal in a second audio coordinate system;
determining an amplitude threshold in the second audio coordinate system defining a maximum level for each of the third component and the fourth component;
applying one or more gain factors to each of the first component and the second component to generate an adjusted first component and an adjusted second component in the first audio coordinate system; and
generating a first output channel and a second output channel in the second audio coordinate system from the adjusted first component and the adjusted second component, the first and second output channels each being limited below the amplitude threshold defined in the second audio coordinate system from the one or more gain factors applied to each of the first component and the second component in the first audio coordinate system.

2. The method of claim 1, wherein applying the one or more gain factors to each of the first component and the second component includes:
determining a priority for spatial limiting between the first component and the second component defining one of the first component or the second component as a primary component, and another one of the first component or the second component as a secondary component;
determining a primary gain factor for the primary component;
applying the primary gain factor to the primary component;
determining a secondary gain factor for the secondary component using the primary gain factor; and
applying the secondary gain factor to the secondary component.

3. The method of claim 1, wherein the one or more gain factors is constrained by a gain reduction budget.

4. The method of claim 1, further comprising applying a smoothing function to the one or more gain factors.

5. The method of claim 1, wherein:
the first audio coordinate system is a mid-side audio coordinate system;
the first component is a mid component;
the second component is a side component;
the second audio coordinate system is left-right audio coordinate system;
the third component is a left component of the audio signal;
the fourth component is a right component of the audio signal;
the first output channel is a left output channel; and
the second output channel is a right output channel.

6. The method of claim 5, wherein applying the one or more gain factors to each of the first component and the second component includes:
   determining a priority for spatial limiting between the mid component and the side component defining one of the mid component or the side component as a primary component, and another one of the mid component or the side component as a secondary component;
   determining a primary gain factor for the primary component;
   applying the primary gain factor to the primary component;
   determining a secondary gain factor for the secondary component using the primary gain factor;
   applying the secondary gain factor to the secondary component;
   determining a left-right gain factor for the primary component and the secondary component using the primary gain factor and the secondary gain factor; and
   applying the left-right gain factor to the primary component to generate an adjusted primary component and to the secondary component to generate an adjusted secondary component.

7. A method of claim 6, wherein:
the primary gain factor is defined by $$\max\left(\theta_I, \min\left(\frac{\vartheta_{LR} - |m_{II}|}{|m_I|}, 1\right)\right);$$

the secondary gain factor is defined by $$\max\left(\theta_{II}, \min\left(\frac{\vartheta_{LR} - |m_I| * \alpha_I}{|m_{II}|}, 1\right)\right);$$

$\alpha_I$ is the primary gain factor;
$\theta_I$ is a primary gain reduction budget for the primary component;
$\theta_{II}$ is a secondary gain reduction budget for the primary component;
$\vartheta_{LR}$ is the left-right threshold;
$|m_I|$ is a peak of the primary component; and
$|m_{II}|$ is a peak of the secondary component.

8. The method of claim 7, wherein:
the left-right gain factor is defined by $$\min\left(\frac{\vartheta_{LR}}{P_{LR}}, 1\right);$$

$\vartheta_{LR}$ is the left-right threshold; and
$P_{LR}$ is a worst-case peak of the audio signal after application of the primary gain factor to the primary component and the secondary gain factor to the secondary component.

9. The method of claim 5, wherein applying the one or more gain factors to each of the first component and the second component includes:
   determining a priority for spatial limiting between the mid component and the side component defining one of the mid component or the side component as a selected component, and another one of the mid component or the side component as a non-selected component;
   determining a gain factor for the selected component;
   applying the gain factor to the selected component;
   determining a left-right gain factor for the selected component and the non-selected component using the gain factor for the selected component; and
   applying the left-right gain factor to the selected component to generate an adjusted selected component and to the non-selected component to generate an adjusted non-selected component.

10. The method of claim 9, wherein:
the gain factor for the selected component is defined by $$\max\left(\theta_{SS}, \min\left(\frac{\vartheta_{LR} - |m_{ns}|}{|m_{ss}|}, 1\right)\right);$$

$\theta_{SS}$ is a gain reduction budget for the selected component;
$\vartheta_{LR}$ is the left-right threshold;
$|m_{ss}|$ is a peak of the selected component; and
$|m_{ns}|$ is a peak of the non-selected component.

11. The method of claim 10, wherein:
the left-right gain factor is defined by $$\min\left(\frac{\vartheta_{LR}}{P_{LR}}, 1\right);$$

$\vartheta_{LR}$ is the left-right threshold; and
$P_{LR}$ is a worst-case peak of the audio signal after application of the gain factor to the selected component.

12. The method of claim 5, wherein applying the one or more gain factors to each of the first component and the second component includes:
   determining a priority for spatial limiting between the mid component and the side component defining the mid component and the side component as equal priority components;
   determining a mid gain factor for the mid component;
   applying the mid gain factor to the mid component;
   determining a side gain factor for the side component;
   applying the side gain factor to the side component;
   determining a left-right gain factor for the mid component and the side component using the mid gain factor and the side gain factor;
   applying the left-right gain factor to the mid component to generate the adjusted mid component and to the side component to generate the adjusted side component.

13. The method of claim 12, wherein:
the mid gain factor is defined by $$\max\left(\theta_m, \min\left(\frac{\vartheta_{LR} - |m_2|}{|m_1|}, 1\right)\right);$$

the side gain factor is defined by $$\max\left(\theta_s, \min\left(\frac{\vartheta_{LR} - |m_1|}{|m_2|}, 1\right)\right);$$

$\vartheta_{LR}$ is the left-right threshold;
$\theta_m$ is a mid gain reduction budget for the mid component;
$\theta_s$ is a side gain reduction budget for the side component;
$|m_1|$ is a peak of the mid component; and
$|m_2|$ is a peak of the side component.

14. The method of claim 13, wherein:
the left-right gain factor is defined by $$\min\left(\frac{\vartheta_{LR}}{P_{LR}}, 1\right);$$

$\vartheta_{LR}$ is the left-right threshold; and
$P_{LR}$ is a worst-case peak of the audio signal after application of the mid gain factor to the mid component and the side gain factor to the side component.

15. The method of claim 1, further comprising:
determining whether the amplitude threshold is satisfied from applying the one or more gain factors; and
in response to determining that the amplitude threshold fails to be satisfied, applying a global gain factor to the audio signal in the first audio coordinate system or the second audio coordinate system to satisfy the amplitude threshold.

16. A non-transitory computer readable medium storing program code, the program code when executed by a processor configures the processor to:
generate a first component and a second component in a first audio coordinate system from a third component and a fourth component of an audio signal in a second audio coordinate system;
determine an amplitude threshold in the second audio coordinate system defining a maximum level for each of the third component and the fourth component;
apply one or more gain factors to each of the first component and the second component to generate an adjusted first component and an adjusted second component in the first audio coordinate system; and
generate a first output channel and a second output channel in the second audio coordinate system from the adjusted first component and the adjusted second component, the first and second output channels each being limited below the amplitude threshold defined in the second audio coordinate system from the one or more gain factors applied to each of the first component and the second component in the first audio coordinate system.

17. The computer readable medium of claim 16, wherein the program code that configures the processor to apply the one or more gain factors to each of the first component and the second component further configures the processor to:
determine a priority for spatial limiting between the first component and the second component defining one of the first component or the second component as a primary component, and another one of the first component or the second component as a secondary component;
determine a primary gain factor for the primary component;
apply the primary gain factor to the primary component;
determine a secondary gain factor for the secondary component using the primary gain factor; and
apply the secondary gain factor to the secondary component.

18. The computer readable medium of claim 16, wherein the one or more gain factors is constrained by a gain reduction budget.

19. The computer readable medium of claim 16, wherein the program code further configures the processor to apply a smoothing function to the one or more gain factors.

20. The computer readable medium of claim 16, wherein:
the first audio coordinate system is a mid-side audio coordinate system;
the first component is a mid component;
the second component is a side component;
the second audio coordinate system is left-right audio coordinate system;
the third component is a left component of the audio signal;
the fourth component is a right component of the audio signal;
the first output channel is a left output channel; and
the second output channel is a right output channel.

21. The computer readable medium of claim 20, wherein the program code that configures the processor to apply the one or more gain factors to each of the first component and the second component further configures the processor to:
determine a priority for spatial limiting between the mid component and the side component defining one of the mid component or the side component as a primary component, and another one of the mid component or the side component as a secondary component;
determine a primary gain factor for the primary component;
apply the primary gain factor to the primary component;
determine a secondary gain factor for the secondary component using the primary gain factor;
apply the secondary gain factor to the secondary component;
determine a left-right gain factor for the primary component and the secondary component using the primary gain factor and the secondary gain factor; and
apply the left-right gain factor to the primary component to generate an adjusted primary component and to the secondary component to generate an adjusted secondary component.

22. The computer readable medium of claim 21, wherein:
the primary gain factor is defined by $$\max\left(\theta_I, \min\left(\frac{\vartheta_{LR} - |m_{II}|}{|m_I|}, 1\right)\right);$$

the secondary gain factor is defined by $$\max\left(\theta_{II}, \min\left(\frac{\vartheta_{LR} - |m_I| * \alpha_I}{|m_{II}|}, 1\right)\right);$$

$\alpha_I$ is the primary gain factor;
$\theta_I$ is a primary gain reduction budget for the primary component;
$\theta_{II}$ is a secondary gain reduction budget for the primary component;
$\vartheta_{LR}$ is the left-right threshold;
$|m_I|$ is a peak of the primary component; and
$|m_{II}|$ is a peak of the secondary component.

23. The computer readable medium of claim 22, wherein:
the left-right gain factor is defined by $$\min\left(\frac{\vartheta_{LR}}{P_{LR}}, 1\right);$$

$\vartheta_{LR}$ is the left-right threshold; and
$P_{LR}$ is a worst-case peak of the audio signal after application of the gain factor to the selected component.

24. The computer readable medium of claim 20, wherein the program code that configures the processor to apply the one or more gain factors to each of the first component and the second component further configures the processor to:
  determine a priority for spatial limiting between the mid component and the side component defining one of the mid component or the side component as a selected component, and another one of the mid component or the side component as a non-selected component;
  determine a gain factor for the selected component;
  apply the gain factor to the selected component;
  determine a left-right gain factor for the selected component and the non-selected component using the gain factor; and
  apply the left-right gain factor to the selected component to generate an adjusted selected component and to the non-selected component to generate an adjusted non-selected component.

25. The computer readable medium of claim 24, wherein: the gain factor for the selected component is defined by $$\max\left(\theta_{SS}, \min\left(\frac{\vartheta_{LR} - |m_{ns}|}{|m_{ss}|}, 1\right)\right);$$

$\theta_{SS}$ is a gain reduction budget for the selected component;
$\vartheta_{LR}$ is the left-right threshold;
$|m_{ss}|$ is a peak of the selected component; and
$|m_{ns}|$ is a peak of the non-selected component.

26. The computer readable medium of claim 25, wherein: the left-right gain factor is defined by $$\min\left(\frac{\vartheta_{LR}}{P_{LR}}, 1\right);$$

$\vartheta_{LR}$ is the left-right threshold; and
$P_{LR}$ is a worst-case peak of the audio signal after application of the gain factor to the selected component.

27. The computer readable medium of claim 20, wherein the program code that configures the processor to apply the one or more gain factors to each of the first component and the second component further configures the processor to:
  determine a priority for spatial limiting between the mid component and the side component defining the mid component and the side component as equal priority components;
  determine a mid gain factor for the mid component;
  apply the mid gain factor to the mid component;
  determine a side gain factor for the side component;
  apply the side gain factor to the side component;
  determine a left-right gain factor for the mid component and the side component using the mid gain factor and the side gain factor; and
  apply the left-right gain factor to the mid component to generate an adjusted mid component and to the side component to generate an adjusted side component.

28. The computer readable medium of claim 27, wherein: the mid gain factor is defined by $$\max\left(\theta_m, \min\left(\frac{\vartheta_{LR} - |m_2|}{|m_1|}, 1\right)\right);$$

the side gain factor is defined by $$\max\left(\theta_s, \min\left(\frac{\vartheta_{LR} - |m_1|}{|m_2|}, 1\right)\right);$$

$\vartheta_{LR}$ is the left-right threshold;
$\theta_m$ is a mid gain reduction budget for the mid component;
$\theta_s$ is a side gain reduction budget for the side component;
$|m_1|$ is a peak of the mid component; and
$|m_2|$ is a peak of the side component.

29. The computer readable medium of claim 28, wherein: the left-right gain factor is defined $$\min\left(\frac{\vartheta_{LR}}{P_{LR}}, 1\right);$$

$\vartheta_{LR}$ is the left-right threshold; and
$P_{LR}$ is a worst-case peak of the audio signal after application of the mid gain factor to the mid component and the side gain factor to the side component.

30. The computer readable medium of claim 16, wherein the program code further configures the processor to:
  determine whether the amplitude threshold is satisfied from applying the one or more gain factors; and
  in response to determining that the amplitude threshold fails to be satisfied, apply a global gain factor to the audio signal in the first audio coordinate system or the second audio coordinate system to satisfy the amplitude threshold.

31. A system for processing an audio signal, comprising: processing circuitry configured to:
  generate a first component and a second component in a first audio coordinate system from a third component and a fourth component of an audio signal in a second audio coordinate system;
  determine an amplitude threshold in the second audio coordinate system defining a maximum level for each of the third component and the fourth component;
  apply one or more gain factors to each of the first component and the second component to generate an adjusted first component and an adjusted second component in the first audio coordinate system; and
  generate a first output channel and a second output channel in the second audio coordinate system from the adjusted first component and the adjusted second component, the first and second output channels each being limited below the amplitude threshold defined in the second audio coordinate system from the one or more gain factors applied to each of the first component and the second component in the first audio coordinate system.

* * * * *